(12) United States Patent
Stemmer

(10) Patent No.: US 8,073,522 B2
(45) Date of Patent: Dec. 6, 2011

(54) METHOD AND MAGNETIC RESONANCE APPARATUS FOR DYNAMIC MAGNETIC RESONANCE IMAGING

(75) Inventor: Alto Stemmer, Abenberg (DE)

(73) Assignee: Siemens Aktiengesellschaft, Munich (DE)

( * ) Notice: Subject to any disclaimer, the term of this patent is extended or adjusted under 35 U.S.C. 154(b) by 1179 days.

(21) Appl. No.: 11/777,338

(22) Filed: Jul. 13, 2007

(65) Prior Publication Data

US 2008/0021304 A1 Jan. 24, 2008

(30) Foreign Application Priority Data

Jul. 21, 2006 (DE) .................... 10 2006 033 862

(51) Int. Cl.
*A61B 5/055* (2006.01)
(52) U.S. Cl. ....................................... 600/410; 324/309
(58) Field of Classification Search .................. 600/410; 324/309
See application file for complete search history.

(56) References Cited

U.S. PATENT DOCUMENTS

| | | |
|---|---|---|
| 6,841,998 B1 | 1/2005 | Griswold |
| 2005/0007114 A1 | 1/2005 | Pipe |
| 2006/0028206 A1 | 2/2006 | Zhang et al. |
| 2006/0232273 A1 | 10/2006 | Takizawa et al. |

OTHER PUBLICATIONS k-t BLAST Reconstruction From Non-Cartesian k-t Space Sampling, Hansen et al., Magnetic Resonance in Medicine, Vol. 55 (2006), pp. 85-91.

Pruessmann et al; Sense: Sensitivity Encoding for Fast MRI; Magnetic Resonance in Medicine, vol. 42, pp. 952-962; 42; Book; 1999.
James G. Pipe; Motion Correction With PROPELLER MRI: Application to Head Motion and Free-Breathing Cardiac Imaging: Magnetic Resonance in Medicine 42: pp. 963-969 (1999); Wiley-Liss, Inc.; 42; Magazine; 1999.
Madore B. et al.; Unaliasing by Fourier-Encoding the Overlaps Using the Temporal Dimension (UNFOLD), Applied to Cardiac Imaging and fMRI; Magn. Reson. Med. vol. 42, pp. 813-828, 1999.
Peter Kellman et al; Adaptive Sensitivity Encoding Incorporating Temporal Filtering (TSENSE); Magn. Reason. Med., vol. 45, pp. 846-852, 2001.
Jeffrey Tsao et al; k-t BLAST and k-t SENSE: Dynamic MRI with High Frame Rate Exploiting Spatiotemporal Correlations; Magn. Reson. Med., vol. 50, pp. 1031-1042, 2003.
Felix A. Breuer et al; Dynamic Autocalibrated Parallel Imaging Using Temporal GRAPPA (TGRAPPA); Magn. Reson. Med., vol. 53, pp. 981-985 2005.

(Continued)

*Primary Examiner* — Brian Casler
*Assistant Examiner* — Jonathan Cwern
(74) *Attorney, Agent, or Firm* — Schiff Hardin LLP

(57) ABSTRACT

The invention concerns a method and magnetic resonance apparatus for acquisition and generation of a time-resolved image series of an anatomical organ with a quasi-periodical movement in a subject, k-space is sampled in segments with a number of partial data sets, with the sampling points of each partial data set corresponding to grid points of a Cartesian sampling grid of a k-space segment, and the Cartesian sampling grids of the k-space segments being rotated relative to one another. A series of sub-data sets is incompletely acquired for each partial data set using alternating sampling schemes. Each incomplete sub-data set is associated with one of the individual images. For at least some of the partial data sets, complete sub-data sets are reconstructed from the incomplete sub-data sets. For the reconstruction of the individual images, in each of the individual images, at least some of the complete sub-data sets that are associated with this individual image are used.

13 Claims, 5 Drawing Sheets

OTHER PUBLICATIONS

J.G. Pipe; Periodically Rotated Overlapping Parallel Lines with Enhanced Reconstruction (PROPELLER) MRI; Application to Motion Correction; ISMRM 1999, Abstract No. 242; Others; 1999.

J.G. Pipe Periodically Rotated Overlapping Parallel Lines with Enhanced Reconstruction (PROPELLER) MRI; Application to Contrast-Enhanced MRA; ISMRM 1999, Abstract No. 157; Others; 1999.

K. Arfanakis et al; k-Space Undersampling in PROPELLER Imaging; Magn. Reson. Med., vol. 53, pp. 675-683 2005.

M.A. Griswold et al; Generalized Autocalibrating Partially Parallel Acquisitions (GRAPPA); Magn. Reson. Med., vol. 47, pp. 1202-1210, 2002.

E.G. Kholmovski et al; GARSE: Generalized Autocalibrataing Reconstruction for Sensitivity Encoded MRI; Proc. Intl. Soc. Magn. Reson. Med., vol. 13, 2005, p. 2672.

J.I. Jackson et al, Selection of a Convolution Function for Fourier Inversion Using Gridding, IEEE Trans. Med. Imag. 10:473-478 1991.

·········· Reconstructed k-space line

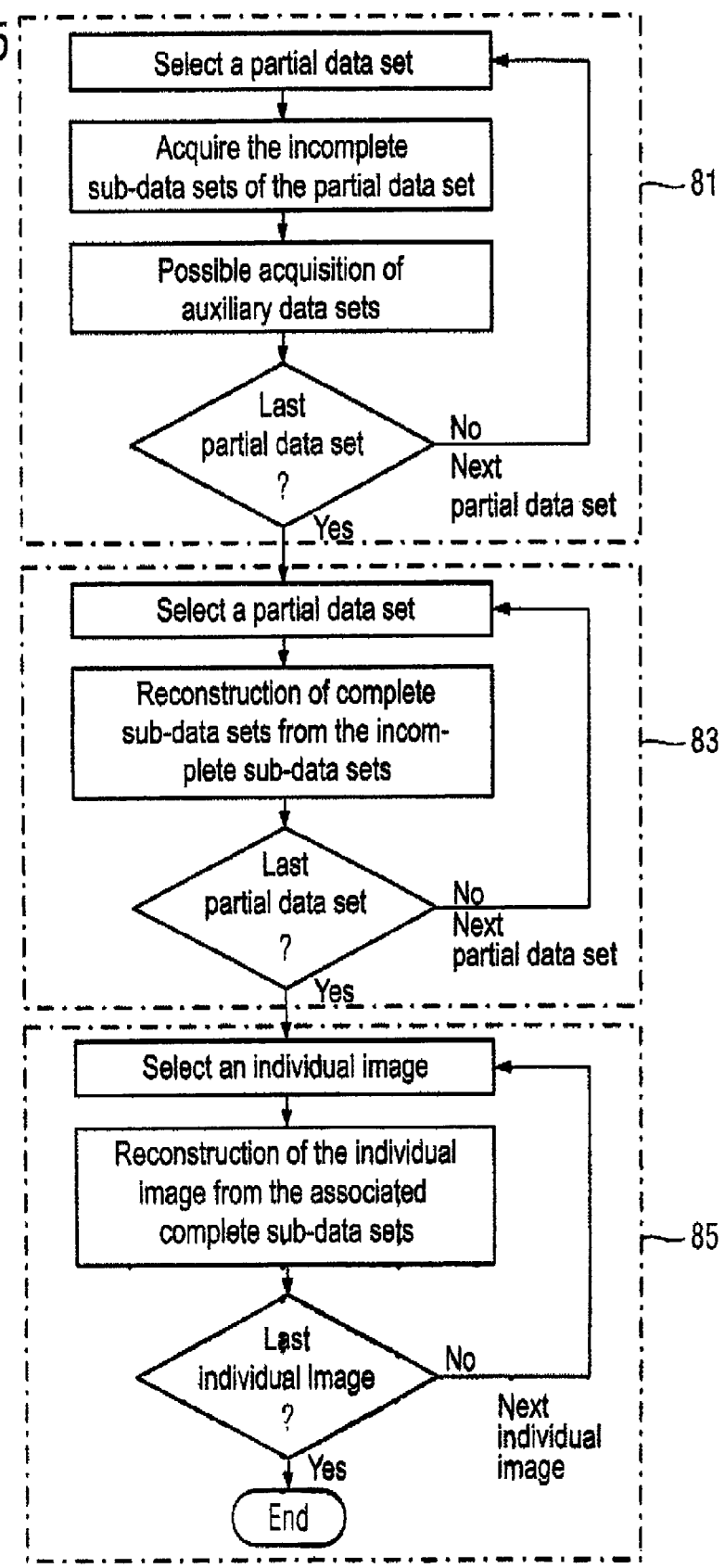

METHOD AND MAGNETIC RESONANCE APPARATUS FOR DYNAMIC MAGNETIC RESONANCE IMAGING

BACKGROUND OF THE INVENTION

1. Field of the Invention

The present invention concerns a method for acquisition and generation of a time-resolved image series by means of magnetic resonance technology, as is particularly suitable in the context of medical examinations for representation of the movement cycle of an anatomical organ with a quasi-periodic movement.

2. Description of the Prior Art

Magnetic resonance imaging is a medical imaging modality that has been successfully established for years. Described with significant simplification, magnetic fields of different strengths and spatial and temporal characteristics hereby induce nuclear magnetic resonances in a subject to be examined that cause detectable signals to be emitted. The detected measurement data are typically arranged in a two-dimensional or three-dimensional mathematical space or domain (known as k-space) that is related with the image space or domain via a Fourier transformation.

In recent times the field of dynamic MRI has been developed, meaning the acquisition of a temporally resolved image series with which movement cycles can be represented. A typical application of dynamic MRI known as CINE imaging of organs that exhibit a quasi-periodic movement, such as, for example, the heart, the lungs, the abdomen or the blood flow through vessels.

Dynamic MRI requires a fast acquisition of the individual images of the temporal image series in order to freeze and temporally resolve the motion-caused changes in the subject to be imaged. Since MRI images often receive long image (data) acquisition times that are not acceptable for this purpose, various further developments are known in order to accelerate the process of the image acquisition. One successfully employed option is that a portion of the total data that are necessary to reconstruct the image are not acquired during the acquisition process and that the missing data are generated using a priori knowledge and/or assumptions that are made about the reconstruction process.

When a Cartesian sampling trajectory is used in the acquisition of the measurement data, meaning that the measurement data are acquired so as to be arranged along a Cartesian grid in k-space, various methods exist for acceleration of the acquisition of measurement data in dynamic MRI. It is common to these methods that the number of the actually-acquired k-space lines per image is decreased by certain k-space lines being skipped-over during the acquisition of the measurement data. Differences primarily exist in the manner of how specific assumptions, a priori knowledge and/or additionally acquired measurement signals are used in order to fill in the k-space lines that were skipped-over in the data acquisition with data reconstructed (interpolated) from the measurement data.

Examples of these methods are known under the names UNFOLD and TSENSE and are described in the following articles: Madore B. et al., "Unaliasing by Fourier-Encoding the Overlaps Using the Temporal Dimension (UNFOLD), Applied to Cardiac Imaging and fMRI", Magn. Reson. Med. 42:813-828, 1999; Peter Kellman, Frederick H. Epstein, Elliot R. McVeigh. "Adaptive sensitivity encoding incorporating temporal filtering (TSENSE)". Magn. Reson. Med. 45:846-852, 2001.

Both methods use sampling schemes in which only every Ath k-space line in both the spatial and in the temporal directions is acquired in the acquisition of the measurement data of the image series (A is a whole-number) while the other k-space lines are skipped-over (not acquired, i.e. no data are entered therein). When the temporal image series is calculated directly from the measurement data, this image series exhibits a multiple-A aliasing in the form of artifacts known as ghost images.

In the UNFOLD method, this image series is Fourier-transformed along the time axis. In frequency space the spectrum of the image series contains A sub-components, namely are component corresponding to the spectrum of the desired image series and A-1 components corresponding to the unwanted ghost images. While the ghost images overlap in the image series, the ghost images are separated in the frequency spectrum: the spectrum of the desired components is localized around the zero frequency while the spectra of the ghost images are shifted by the value $N_p/A$ ($N_p$=number of the individual images of the image series). The UNFOLD method uses a low-pass filter in order to suppress the unwanted components. In general, however, the spectra of the unwanted components and the spectra of the ghost images overlap to a certain degree. This overlap cannot be separated by the filtering, such that in general the filtering leads either to a temporal smearing (due to filtering of high-frequency components) or to a retention of ghost image artifacts (due to insufficient suppression of the corresponding components) in the image series.

The TSENSE method is based on the UNFOLD method. The measurement data are acquired with multiple coil elements and, for the removal of the aliasing in the image series, the respective, different coil sensitivity profiles are additionally used that are determined directly from the under-sampled measurement data using the UNFOLD method. An improved elimination of the aliasing results in this manner.

Further methods based on the same sampling schemes are known under the names kt-BLAST, kt-SENSE and TGRAPPA and are described in the following articles: Jeffrey Tsao, Peter Boesiger, Klaas P. Pruessmann. "k-t BLAST and k-t SENSE: Dynamic MRI with high frame rate exploiting spatiotemporal correlations", Magn. Reson. Med. 50:1031-1042, 2003; Felix A. Breuer, Peter Kellman, Mark A. Griswold, Peter M. Jakob. "Dynamic autocalibrated parallel imaging using temporal GRAPPA (TGRAPPA)". Magn. Reson. Med. 53:981-985, 2005.

A disadvantage of these methods is that an intensification of artifacts and/or noise occurs, causing, a higher temporal blurring and a lower temporal resolution compared with a completely acquired static subject, or a completely acquired temporal image series with a decreased spatial resolution.

Furthermore, in MRI it is known that non-Cartesian methods of k-space sampling can be advantageous in the acquisition of the measurement data, in particular the use of radial-like sampling patterns of k-space. These methods are primarily characterized by their robustness with regard to an under-sampling and with regard to artifacts, in particular with regard to movement artifacts.

Attempts therefore exist to use non-Cartesian k-space sampling patterns in dynamic MRI in order to reduce remaining artifacts and/or to increase the signal-to-noise ratio and/or to attain further acceleration. For example, a number of methods that all exhibit severe disadvantages in comparison to a Cartesian sampling are discussed in the document by Hansen, Michael S. et al., "k-t BLAST reconstruction from non-Cartesian k-t space sampling", Magn. Res. Med. 55:85-91, 2006. For example, the disclosed methods exhibit reconstruction times of multiple hours, which is why they can be used only very rarely in clinical imaging, since this leads to unwanted delays in clinical workflows and high costs.

Another method that is used both for static and dynamic MRI is known under the name PROPELLER MRI and is, for example, described in the documents by J. G. Pipe, "Periodically Rotated Overlapping ParallEL Lines with Enhanced Reconstruction (PROPELLER) MRI; Application to Motion Correction", ISMRM 1999, abstract Nr. 242 and "Periodically Rotated Overlapping ParallEL Lines with Enhanced Reconstruction (PROPELLER) MRI; Application to Contrast-Enhanced MRA", ISMRM 1999, abstract Nr. 157 and "Motion Correction with PROPELLER MRI: application to head motion and free-breathing cardiac imaging", Magn. Reson. Med. 42:963-969, 1999.

For MRI using the PROPELLER technique k-space is covered in a blade-like manner with respective right-angled k-space segments (Engl.: often also designated as "blades" or "stripes") that are rotated relative to one another around a central k-space point.

Among other things, it is advantageous in this type of k-space sampling that an unwanted movement of the subject to be examined that can occur between the acquisition of two k-space segments can be determined. Depending on the type of the movement, this can either be calculated out in the reconstruction of the image data or at least be accounted for such that artifacts as a consequence of the patient movement are suppressed comparably well.

In the article by J. G. Pipe entitled "Periodically Rotated Overlapping ParallEL Lines with Enhanced Reconstruction (PROPELLER) MRI; Application to Contrast-Enhanced MRA", ISMRM 1999, abstract Nr. 157, the PROPELLER technique is used in a special embodiment for dynamic contrast agent examination. The method described therein, however, cannot be used without further measures for representation of quasi-periodic movement cycles, for example the movement of the heart.

SUMMARY OF THE INVENTION

An object of the present invention is to provide a method for dynamic MRI that allows a high temporal and spatial resolution, that requires a small reconstruction time and that is robust with regard to artifacts, in particular with regard to movement artifacts and magnetic field inhomogeneities and with regard to an under-sampling of k-space. Furthermore, it is an object of the invention to provide a magnetic resonance apparatus or a computer software product (i.e. a computer-readable medium encoded with a data structure) for dynamic MRI, with a high temporal and spatial resolution with simultaneously lower reconstruction time and robustness with regard to artifacts.

This object is the invention by a method for acquisition and generation of a time-resolved magnetic resonance image series (i.e. an image series containing multiple individual images) of an organ undergoing a quasi-periodical movement, wherein k-space is sampled in segments with a plurality of partial data sets, the sampling points of each partial data set corresponding to grid points of a Cartesian sampling grid of a k-space segment, and the Cartesian sampling grids of the k-space segments are rotated relative to one another, and wherein a number of incomplete sub-data sets are acquired for each partial data set, each incomplete sub-data set being respectively associated with one of the individual images, and wherein the acquisition of the incomplete sub-data sets ensues along the sampling grid associated with the partial data set with different, alternating sampling schemes, and wherein other grid points of the sampling grid associated with the partial data set are respectively sampled using the different sampling schemes. For at least some of the partial data sets, complete data sets are reconstructed from the incomplete data sets and individual images are reconstructed by using, for each of the individual images, at least some of the complete sub-data sets that are associated with that individual image.

In the inventive method a radial-like sampling of k-space is consequently used since the individual k-space segments are rotated relative to one another, but the individual k-space segments are respectively sampled with a Cartesian sampling scheme. The sampling of a k-space segment ensues with a number of sub-data sets, with each sub-data set being associated with an individual image of the time-resolved image series, meaning that the quasi-periodic movement of the subject to be examined is retained in the individual sub-data sets.

The acquired sub-data sets thus are incomplete, meaning that not all grid points of the k-space segment are occupied by measurement data in the data acquisition procedure. The acquisition of the incomplete sub-data sets, however, has been done with a number of incomplete, successively alternating sampling schemes. Other grid points of the k-space segment have respectively been sampled in the different sampling schemes. A temporal series of incomplete sub-data sets with Cartesian sampling patterns has consequently been generated by the repeating sampling schemes, such that the methods noted earlier can now be used in order to complete the temporal series of incomplete sub-data sets, and thus to obtain a series of complete sub-data sets for each partial data set.

This reconstruction advantageously ensues for each of the individual partial data sets. A series of complete sub-data sets is obtained in this manner with regard to each k-space segment. Each of these series of complete sub-data sets embodies (represents) the quasi-periodic movement of the subject to be examined.

The reconstruction of the individual images of the image series ensues for each of the individual images, all completed sub-data sets that are associated with this individual image being used for reconstruction. The reconstruction of the individual images from the associated sub-data sets thus ensues with known methods of the PROPELLER reconstruction technique. A method often used in PROPELLER reconstruction is known as the gridding method, or simply as gridding. A detailed description of this method is found in the article by J. I. Jackson et al., "Selection of a Convolution Function for Fourier Inversion Using Gridding", IEEE Trans. Med. Imag. 10:473-478, 1991.

From the article by Arfanakis K. et al., "k-Space Undersampling in PROPELLER Imaging", Magn. Reson. Med. 53:675-683, 2005 it is known that qualitatively high-grade images can also be reconstructed when k-space is not completely covered with k-space segments rotated relative to one another. For this reason it can be advantageous to omit complete partial data sets in the acquisition in order to further reduce the measurement time. For this reason it is also not absolutely necessary to use every one of the complete sub-data sets that are associated with an individual image for reconstruction of an individual image. For example, if individual sub-data sets are identified as being afflicted with artifacts during the reconstruction (for example as a consequence of unwanted patient movement that is superimposed on the quasi-periodic organ movement), those "bad" data sets are not used in the reconstruction). For this reason, it is also not absolutely necessary to implement a reconstruction of complete sub-data sets in each partial data set.

The incomplete sub-data sets of a partial data set preferably are acquired immediately after one another in succession. This allows the data sets to be acquired while the gradient fields that are activated during the acquisition of the measurement data are as uniform as possible, so as to minimize unwanted effects that would cause artifacts (for example, as a result of eddy currents). In the event that unwanted patient movements occur during the examination (which patient movement is superimposed on the dynamic organ movement), data acquisition in this manner will also generally reduce the number of the corrupted partial data sets.

In a preferred embodiment, the acquisition of the incomplete sub-data sets of a partial data set occurs after a trigger point that characterizes the quasi-periodic movement of the organ. The acquisition of the individual incomplete sub-data sets (of which each sub-data set is associated with an individual image) thus can be matched with the movement of the organ.

By the acquisition of the entire incomplete sub-data sets that are associated with a partial data set, all grid points of the sampling grid associated with this partial data set are preferably sampled. This means that, through the entirety of all sampling schemes of the individual sub-data sets, all grid points of the partial data set that is associated with these sub-data sets are sampled. This preferred embodiment is typically also used in order to be able to implement a particularly precise completion of the incomplete sub-data sets, but is not absolutely necessary. For example, sampling schemes can also be fashioned such that all grid points of central regions of the k-space segments are sampled by the entirety of the sampling schemes, but not all grid points in the edge (peripheral) regions of the k-space segments are filled by the entirety of the sampling schemes.

All grid points of the sampling grid associated with the partial data set are advantageously sampled multiple times by the acquisition of the entire incomplete sub-data sets. When all grid points of the sampling grid associated with a partial data set are sampled multiple times, complete sub-data sets can be reconstructed particularly precisely from the incomplete sub-data sets.

In another preferred embodiment, the different sampling schemes used in the acquisition of the incomplete sub-data sets alternate cyclically. Sampling schemes that alternate cyclically generate a periodicity in the acquisition of the incomplete sub-data sets. This allows a simple reconstruction of the complete sub-data sets therefrom.

In an embodiment that can be implemented particularly simply, A different sampling schemes are used that are characterized by only every Ath k-space line of the sampling grid being sampled in each sampling scheme, and the sampled k-space lines are shifted from sampling scheme-to-sampling scheme. The number A is typically a single-digit whole number. The use of such sampling schemes can be realized particularly simply and has the advantage that such sampling schemes allow a particularly simple reconstruction of complete sub-data sets from incomplete sub-data sets.

The acquisition of the incomplete sub-data sets advantageously ensues with a number of coil elements each with a different spatial sensitivity, and information as to the respective sensitivities of the individual coil elements is used in the reconstruction of the complete sub-data sets from the incomplete sub-data sets. The precision of the reconstruction of complete sub-data sets from incomplete sub-data sets is thereby increased.

In an embodiment of the method, the reconstruction of the complete sub-data sets from the incomplete sub-data sets is implemented using further complete auxiliary data sets that are associated with a central k-space range. Such auxiliary data sets allow a particularly simple and precise reconstruction of the sub-data sets.

The individual k-space segments preferably are rotated relative to one another around a central point of k-space. The individual k-space segments thus intersect in a central region of k-space. This intersection requires that measurement data that are associated with this central region are acquired in each sub-data set. A comparison of such measurement data that were acquired multiple times can be advantageously used in the reconstruction of the complete sub-data sets or the individual images of the image series. For example, in the step of the reconstruction of the individual images from the complete sub-data sets, an unwanted patient movement that has occurred in the image plane between the acquisition of the individual sub-data sets (and is superimposed on the dynamic movement of the organ) can be detected and (depending on the type of the movement) can be partially or even completely corrected. If a correction of the artifacts is not possible, partial or sub-data sets that are populated with particularly severe artifacts can be identified in this manner so that these partial or sub-data sets can be omitted from the further reconstruction.

If the k-space segments intersect in a central region and if a method that uses auxiliary data sets for reconstruction is selected for the reconstruction of the complete sub-data sets from the incomplete sub-data sets, the auxiliary data sets preferably are calculated from the incomplete sub-data sets. In this manner the time that would be necessary for acquisition of the auxiliary data sets can be saved during the acquisition of the measurement data.

In another embodiment, however, the auxiliary data sets can be acquired in addition to the incomplete sub-data sets. In this embodiment the reconstruction time can be shortened since the auxiliary data sets now do not have to be calculated from the incomplete sub-data sets but, since the auxiliary data sets have been directly acquired with the incomplete sub-data sets, the acquisition time of the measurement data is thereby increased. For example, the aforementioned kt-BLAST and kt-SENSE methods employ auxiliary data sets for reconstruction of complete data sets.

The above object is also achieved in accordance with the present invention by a computer-readable medium encoded with a data structure that, when the computer-readable medium is loaded into a computer that processes data obtained from a magnetic resonance data acquisition apparatus, causes the computer to implement the method described above, including all variations and embodiments described above.

The above object is also achieved in accordance with the present invention by a magnetic resonance apparatus that is designed and operated in order to implement the method described above, including all embodiments and variations.

DESCRIPTION OF THE DRAWINGS

FIG. 5 is an exemplary flow chart of the inventive method.

DESCRIPTION OF THE PREFERRED EMBODIMENTS

Figure 1:
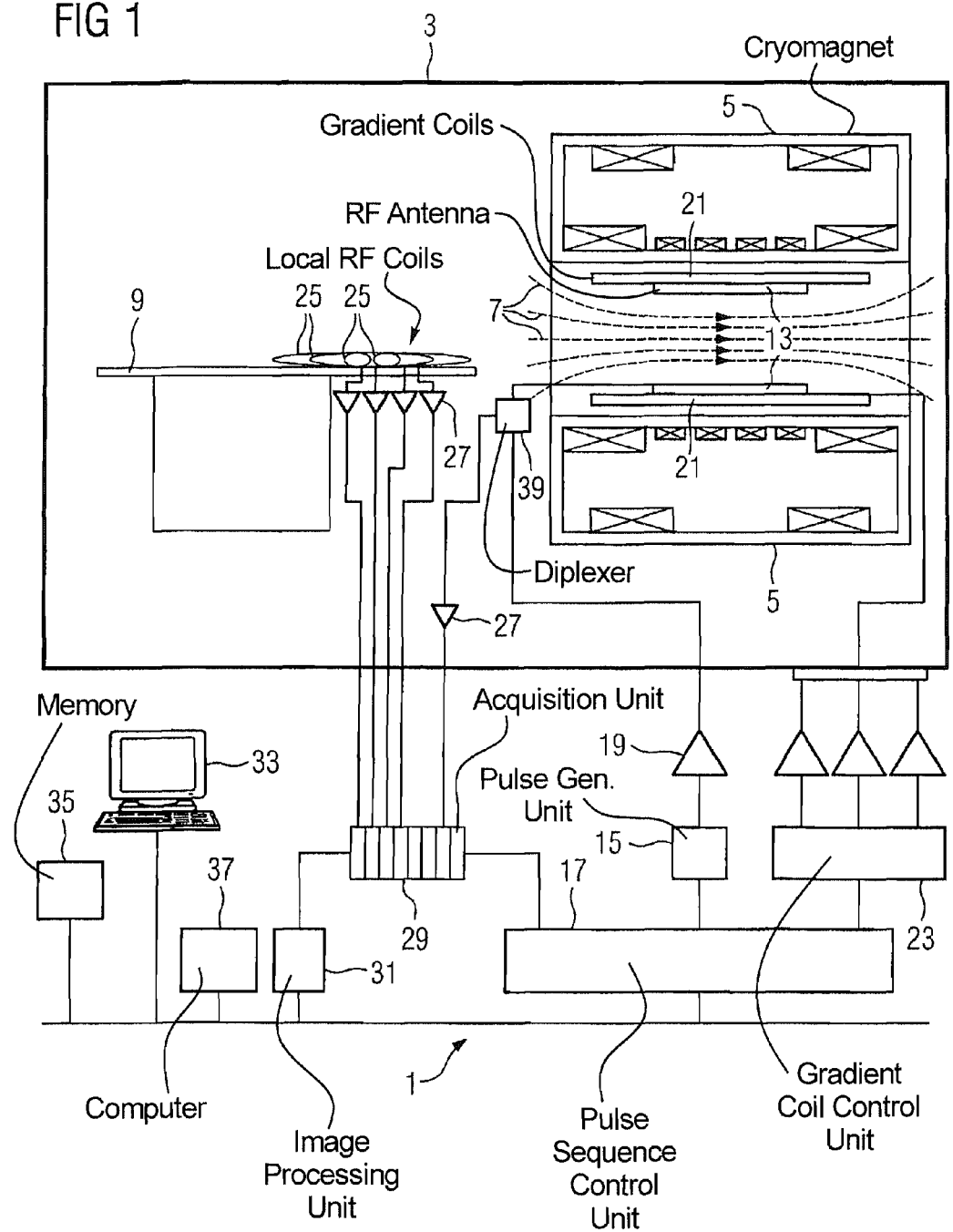
FIG. 1 is a schematic overview of a magnetic resonance apparatus operable in accordance with the invention.

FIG. 1 schematically shows the basic design of a magnetic resonance apparatus 1. The components of the magnetic resonance apparatus 1 with which the actual measurement is implemented are located in a radio-frequency-shielded measurement chamber 3. In order to examine the body of a subject by means of magnetic resonance imaging, various magnetic fields tuned precisely to one another in terms of their temporal and spatial characteristics are radiated at the body.

A strong magnet, typically a cryomagnet 5 with a tunnel-shaped opening, generates a strong, static basic magnetic field 7 that typically amounts to 0.2 Tesla to 3 Tesla and more, and that is substantially homogeneous within a measurement volume. A body to be examined (not shown) is placed on a patient bed 9 and is positioned in the basic magnetic field 7, more precisely in the measurement volume.

The excitation of nuclear spins in the body ensues by radio-frequency electromagnetic excitation pulses that are radiated by a radio-frequency antenna (shown here as a body coil 13). The radio-frequency excitation pulses are generated by a pulse generation unit 15 that is controlled by a pulse sequence control unit 17. After amplification in a radio-frequency amplifier 19, they are conducted to the radio-frequency antenna. The radio-frequency system is only schematically indicated. Typically more than one pulse generation unit 15, more than one radio-frequency amplifier 19 and a number of radio-frequency antennas are used in a magnetic resonance apparatus 1.

Furthermore, the magnetic resonance apparatus 1 has gradient coils 21, with which gradient fields for selective slice excitation and for spatial coding of the measurement signals are radiated in a measurement. The gradient coils 21 are operated by a gradient coil control unit 23 that, like the pulse generation unit 15, is connected with the pulse sequence control unit 17.

The signals emitted by the excited nuclear spins (magnetic resonance signals) are acquired by the body coil 13 and/or by local coils 25, are amplified by associated radio-frequency amplifiers 27, and are further processed and digitized by an acquisition unit 29. The acquisition coils can be formed as a number of coil elements with which magnetic resonance signals are simultaneously acquired.

In the case of a coil that can be operated both in transmission mode and in acquisition mode (such as, for example, the body coil 13), the correct signal relaying is regulated by an upstream transmission/reception diplexer 39.

An image processing unit 31 generates an image from the measurement data, this image being shown to a user via an operator console 33, or being stored in a storage unit 35. A central computer 37 controls the individual system components. The computer 37 and the further components are designed such that the inventive method can be implemented with these components.

Figure 2:
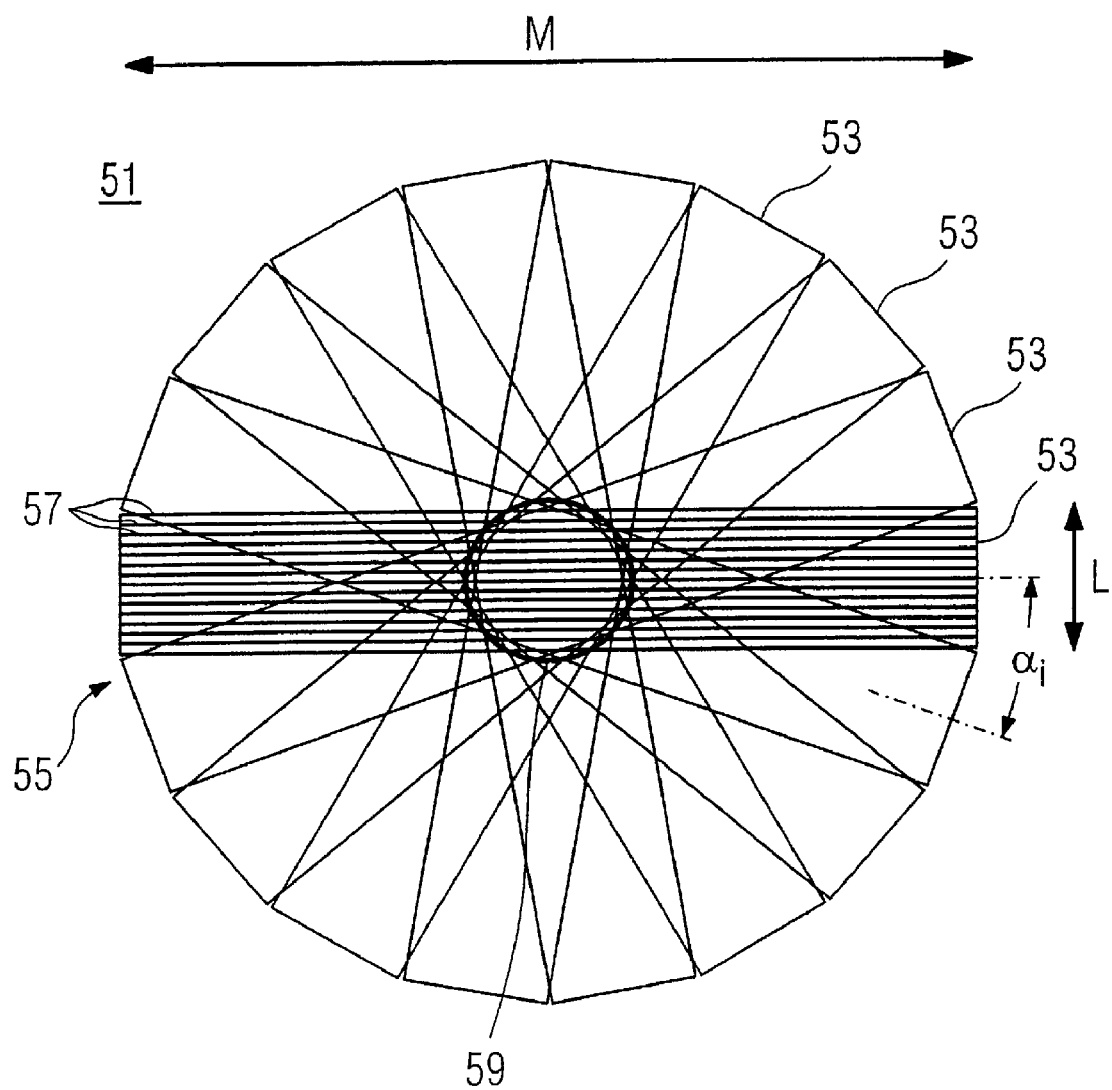
FIG. 2 illustrates a PROPELLER-like covering of k-space with individual k-space segments along which a sampling respectively ensues along a Cartesian sampling grid suitable for use in an embodiment of the invention.

FIG. 2 illustrates an example of k-space sampling for a preferred embodiment of the inventive method, that corresponds to the sampling type of the PROPELLER technique. A two-dimensional k-space matrix 51 is thereby covered with individual k-space segments 53. The sampling points of each k-space segment 53 lie on a Cartesian sampling grid 55 in each k-space segment 53.

For clarity, the sampling grid 55 is shown only at one k-space segment 53 in the form of 15 central (i.e. arranged around the zero point) k-space lines 57 (L=15) that are arranged equidistantly parallel in the phase coding direction.

The length of each k-space line 57 covers the full width of the k-space matrix 51 (M=192 matrix points in the example mentioned here), but this is not absolutely necessary.

The individual k-space segments 53 are rotated relative to one another around a central point so that a central, circular region 59 of the k-space matrix 51 is covered by each k-space segment 53 and so that the measurement data is sampled each time in the acquisition. The rotation angle $\alpha_i$ and the number $N_B$ of the k-space segments 53 represent characteristic parameters that are selected such that the k-space segments 53 cover the entire k-space region of interest. The letter B stands for the term "blade" with which the individual k-space segments 53 are often designated in a PROPELLER-like k-space sampling. In general, k-space coverage is ensured when $$N_B \geq \frac{\pi}{2} \times \frac{M}{L}.$$

In comparison to other acquisition techniques in MRI, the PROPELLER technique has the advantage that the central circular region 59 (with diameter L) in the center of k-space is equally covered by every single k-space segment 53. After acquisition of the measurement data, a comparison of the measurement data of the different k-space segments 53 in the circular region 59 allows movements of the subject to be examined that occurred in the acquisition of the measurement data of the various k-space segments 53 to be determined. The information acquired in this manner can then be taken into account in the reconstruction of the image data using the measurement data of all k-space segments 53, so it is possible to distinctly reduce movement artifacts in the images. In the exemplary embodiment of the inventive method presented here, this advantage of a PROPELLER-like k-space segmenting is also used in the method step of the reconstruction of the individual images from completed sub-data sets.

Although a two-dimensional k-space matrix 51 is shown here for simplicity and clarity, the method can also be used with three-dimensional sampling schemes as long as the sampling points of the three-dimensional k-space segments lie on a Cartesian sampling grid and the k-space segments are rotated relative to one another.

Figure 3:
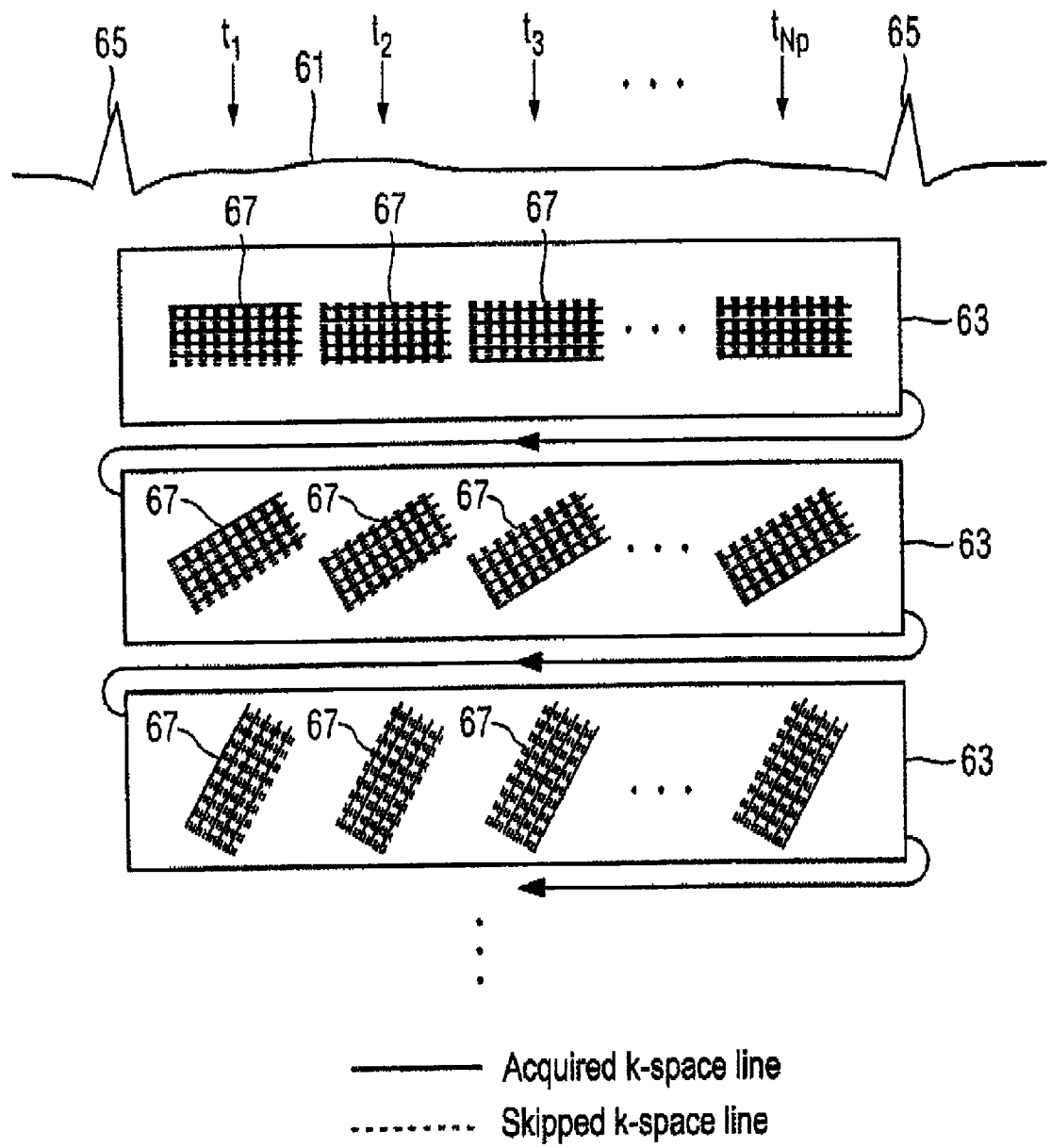
FIG. 3 is an overview of the acquisition of the measurement data during the heart cycles in an embodiment of the invention, wherein the acquisition is divided into the acquisition of partial and sub-data sets.
Figure 4:
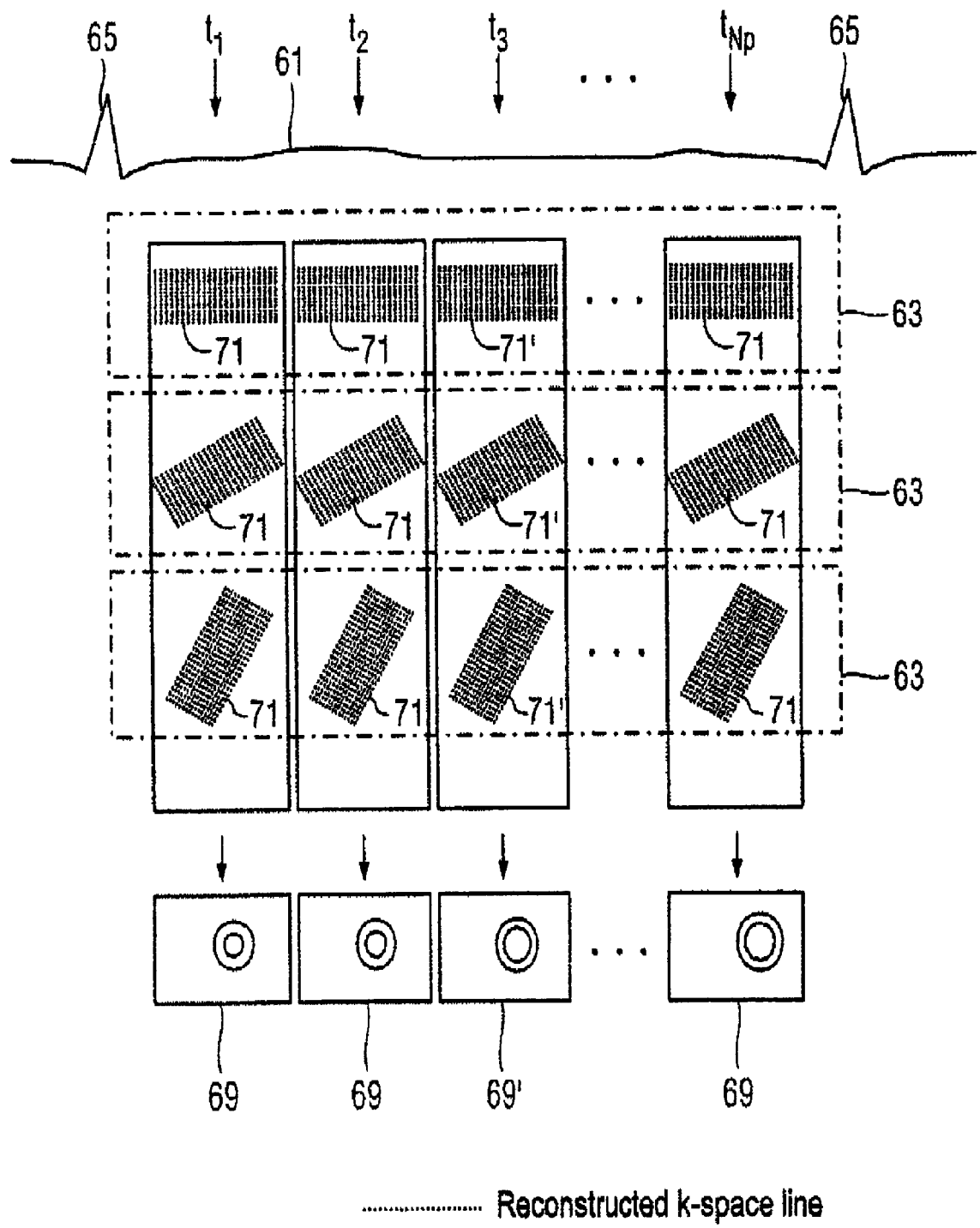
FIG. 4 is an overview of an embodiment of the reconstruction of individual images of an image series from the measurement data used with the data acquisition embodiment of FIG. 3.

The acquisition of the measurement data and the reconstruction of the image series from the measurement data are described in FIG. 3 and FIG. 4, respectively. FIG. 3 shows an overview of the division and the temporal workflow of the acquisition of the measurement data in the inventive method.

The exemplary embodiment described here is explained using the example of acquisition and generation of a time-resolved image series of a beating heart. The acquisition of the measurement data ensues during a number of heart cycles. The course of a heart cycle is indicated by an ECG (electrocardiogram) line 61. The ECG, as a monitor of the quasi-periodic movement of the heart, is typically also acquired from a patient during the measurement procedure.

The time-resolved image series with which the movement of the heart is reproduced contains $N_p$ individual images. The subscript P stands for a particular temporal phase during the movement cycle of the heart that is to be rendered by one of the individual images. Respective points in time $t_1 \ldots t_{N_p}$ of the movement cycle are associated with the individual images (one individual image at each point in time).

In the present invention the k-space sampling ensues successively in a number of partial data sets 63, with each of the partial data sets 63 being acquired in a heart cycle that begins with an R-wave spike 65 that is detected in the EKG.

In each partial data set 63, data of one k-space segment 53 are acquired. The acquisition of the partial data set 63, thus the sampling of the associated k-space segment 53, ensues in $N_p$ incomplete sub-data sets 67. In the acquisition of the partial data set 63, the sampling of the k-space segment is consequently repeated $N_p$ times, respectively at the points in time $t_1 \ldots t_{N_p}$ of the individual images.

Only after acquisition of the complete partial data set 63 via $N_p$ incomplete sub-data sets 67 is the next partial data set 63 acquired with which the next k-space segment 53 is sampled, this next k-space segment 53 being rotated by the rotation angle a relative to the preceding k-space segment 53. In the present example the acquisition of a partial data set 63 again ensues after detection of an A-wave spike 65 in the ECG line.

The acquisition of the incomplete sub-data sets 67 means that the sampling grid 55 associated with the k-space segment 53 is not completely acquired, i.e. not every grid point of the sampling grid 55 is populated with a measurement value.

In the example shown here, for the acquisition of an incomplete sub-data set 67 only every Ath k-space line 57 (symbolized by solid lines) is sampled, while the other k-space lines 57 (symbolized by dashed lines) are skipped-over. In the acquisition of the individual incomplete sub-data sets 67, other k-space lines 57 are respectively sampled or skipped-over in succession. For example, when only every Ath k-space line 57 is acquired, A different sampling schemes result with which the k-space segment 53 is sampled successively for the acquisition of the incomplete sub-data sets 67. A spatiotemporal acceleration factor of A results from the sampling of only every Ath k-space line 57. In the present example, the number A has the value 3. For example, for a value A=2 two sampling schemes would result that would always sample either even-numbered or odd-numbered k-space lines 57.

In the acquisition of the incomplete sub-data sets 67, these A-varying sampling schemes are sequentially applied so that all k-space lines 57 of a k-space segment 53 have been acquired after A acquired incomplete sub-data sets.

These sampling schemes presented here have the advantage of allowing a particularly simple reconstruction of complete sub-data sets from the incomplete sub-data sets. The reconstruction of a complete sub-data set can ensue with known methods described above, as are used in the case of analogous sampling schemes.

The inventive method, however, is not limited to the described sampling schemes in which entire k-space lines 57 are either acquired or skipped-over. The inventive method also can be used when the acquisition of the incomplete sub-data sets 67 ensues generally with different, deviating sampling schemes, so that different grid points of the k-space segment 53 (i.e. the associated sampling grid 55 thereof) are respectively sampled in the different sampling schemes.

The entire acquired data set is thus divided into $N_B$ partial data sets 63 by the division of the measurement data shown in FIG. 3. Each of these partial data sets 63 is again divided up into $N_p$ incomplete sub-data sets that are associated with one of the $N_B$ k-space segments 53.

Given the described division of the measurement data into partial data sets and incomplete sub-data sets 67, the temporal arrangement of the acquisition of the measurement data occurs such that all sub-data sets 67 are first sequentially acquired in one partial data set 63 and such that the acquisition of the next partial data set 63 only thereupon occurs. This order of the acquisition is particularly suitable for the implementation in a magnetic resonance apparatus, but the inventive method is not limited to this special embodiment of the sequential measurement data acquisition; other orders of the acquisition can also be used in which the acquisition of the partial data sets 63 and incomplete sub-data sets 67 are interleaved with one another.

A closer specification of the sequence with which the measurement data are acquired ensues before specification of the reconstruction of the individual images 69 from the acquired measurement data using FIG. 4. In particular attention is directed to the time durations typical for the sequence, these time durations being set in relation to characteristic time durations of the movement of the heart and further physiological parameters.

The specific sequence that is used for acquisition of the measurement data thus plays a subordinate role, as long as a Cartesian sampling of k-space is enabled with the sequence. For example, a TrueFISP sequence (TrueFISP for "true fast imaging with steady-state precession"), also known under the designations SSFB (for "refocused/balanced steady-state free precession"), FIESTA (for "Fast Imaging Employing Steady State Acquisition"), balanced FFE (for "Fast Field Echo"), has proven useful for CINE imaging of the heart. During the acquisition of the image data the patient is instructed to hold his breath. The acquisition of the measurement data starts each time an R-wave spike 65 is detected in the ECG, with $N_p$ incomplete sub-data sets 67 being acquired after each R-wave spike 65. S k-space lines 57 are acquired in each incomplete sub-data set 67. After acquisition of S k-space lines 57, the sequence acquires the next incomplete sub-data set 67. The number S typically has a value of 15; in this manner the acquisition of an incomplete sub-data set 67 requires approximately 50 ms. This value simultaneously represents the temporal resolution of the image series. If it is assumed that 900 ms are available for acquisition of measurement data after an R-wave spike 65 (a typical value given a heart rate of 60/min), $N_p$=18 successive, incomplete sub-data sets 67 (corresponding to $N_p$=18 individual images 69 of the temporally-resolved image series) can thus be acquired.

More or less than 18 incomplete sub-data sets 67 are acquired after an R-wave spike 65 dependent on the heart frequency of the patient, such that the temporal image series exhibits a correspondingly different number of individual images 69. When $T_S$ designates the time duration that is required in order to sample S k-space lines and $T_A$ designates the time duration of the acquisition time window after an R-spike 65, for example, the number of the individual images 69 of the temporal image series can be calculated using the following formula:

$$N_P = \left(\frac{T_A}{T_S}\right)_{A,2},$$

wherein the symbol $(\cdot)_{A,2}$ indicates that the value standing in parentheses is rounded to the next smallest whole number that is even and is a multiple of the spatiotemporal acceleration factor A.

When only every third k-space line 57 is sampled in each incomplete sub-data set 67, i.e. when the spatiotemporal acceleration factor A=3, the Cartesian sampling grid of the associated k-space segment 53 exhibits L=A·S=45 k-space lines 57. Given assumption of a quadratic k-space matrix 51 and a matrix size of M=192 matrix points, the k-space lines 57 also exhibit a line length of 192 matrix points. In this case 6 to 7 k-space segments 53 for coverage of the k-space matrix 51 result using the estimation $$N_B = \frac{\pi}{2} \times \frac{M}{L}.$$

to 7 heartbeats are correspondingly necessary in order to acquire the movement of the heart in one slice. When one assumes that a patient can hold his or her breath for a maximum of 20 sec and one assumes a heart frequency of 60/min, at maximum 20 heartbeats are available for acquisition of the measurement data without berating movement. This means that approximately two to three slices of the heart can be acquired during one breath-hold time. To show the entire heart, typically 12 contiguous short axis slices with a slice thickness of 8 mm are required in order to show the entire left ventricle from the cardiac apex to the base of the heart.

One goal in the imaging of the heart is therefore to keep the number of heartbeats that are required in order to acquire a slice optimally low. The lower this number of heartbeats, the more slices that can be acquired during one breath-hold, such that in total fewer breath-holds are needed in order to show the entire heart. Alternatively, a fast acquisition technique can also be used to shorten the breath-hold times, which is particularly of great advantage for patients with heart-circulation problems. Further alternatives for application of the inventive method are to leave the number of the breath-holds and the duration of the breath-hold approximately the same in comparison to the unaccelerated measurement, but to increase the temporal resolution (by reduction of S) and/or the spatial resolution (by increase of M). Through parameter selection of A, S, M and the number of slices per breath-hold, the user can establish which of the three alternatives the user would like to take advantage of, and to which extent. Further possibilities to reduce the acquisition times with the inventive method as needed are explained later.

Although the inventive method was described in detail above using the example of CINE imaging, it is also applicable in other application fields for generation of a temporal image series, and is in particular suitable for representation of a quasi-periodic movement of an organ such as, for example, the movement of the lungs or the organs of the abdomen.

FIG. 4 shows an overview of the reconstruction of individual images of an image series from the measurement data.

Since the sampling of a k-space segment 53 in the acquisition of a partial data set 63 ensues with a Cartesian sampling scheme, the measurement data that are missing (i.e. were skipped-over) in the incomplete sub-data sets 67 (in the specific case the respective skipped-over k-space lines 57) can be supplemented in a known manner so that complete sub-data sets 71 (symbolized by the dotted lines) are reconstructed from the incomplete sub-data sets 67. The occurrence of aliasing, which would otherwise be present given a skipping of k-space lines 57 in the acquisition, thus can be eliminated.

Examples of methods that are suitable for the reconstruction of the complete sub-data sets 71 from the incomplete sub-data sets 67 have been noted above, and include UNFOLD, TSENSE, kt-BLAST, kt-SENSE and TGRAPPA.

Some of these methods operate with auxiliary data sets acquired in addition to the actual measurement data, these auxiliary data sets often being designated as training data sets. Such auxiliary data sets are typically completely acquired image data sets, but with a reduced spatial resolution and optionally with a reduced temporal resolution. In the methods specified above these auxiliary data sets can be acquired, for example, before, after or even during the acquisition of the incomplete sub-data sets 67. In the inventive method, auxiliary data sets can likewise be acquired in addition to the incomplete sub-data sets 67 in an analogous manner corresponding to the reconstruction methods. The auxiliary data sets that can be optionally acquired as well are not shown in FIG. 3 and FIG. 4, for clarity.

The specification of a specific method of reconstruction of $N_p$ complete sub-data sets 71 from the $N_p$ incomplete sub-data sets 67 of a partial data set 63 now follows. No specially acquired auxiliary data sets are necessary for reconstruction according to this method. The acquisition of the incomplete sub-data sets 67 ensues using a number of coil elements that each exhibit a different spatial sensitivity.

A modified GRAPPA-like method can be used in order to reconstruction the data of the unsampled k-space lines 57 from the measurement data of the incomplete sub-data sets 67. The method known as "GRAPPA" is a method for parallel imaging (GRAPPA for "GeneRalized Autocalibrating Partially Parallel Acquisition"); is described, for example, in DE 101 26 078 B4 or by Griswold M. A. et al. in "Generalized Autocalibrating Partially Parallel Acquisitions (GRAPPA)", Magn. Reson. Med. 47:1202-1210, 2002; and is used to eliminate aliasing artifacts that arise due to an under-sampling of k-space given simultaneous acquisition of the measurement data with multiple coil elements. For each coil element, each data point of an unsampled k-space line 57 is separately calculated as a weighted linear combination from adjacent (in k-space) and sampled measurement data of a number of coil elements. The weighting factors necessary for this purpose are typically determined using additionally-acquired k-space lines 57 that would not have been recorded by the sampling scheme of the under-sampling.

In the method presented here, the weighting factors are determined without additional acquisition of k-space lines 57 in the incomplete sub-data sets 67, but rather with the aid of auxiliary data sets that are acquired from the incomplete sub-data sets 67.

A more detailed explanation of the individual steps of the reconstruction of incomplete sub-data sets now follows.

Step 1: All acquired measurement data of a partial data set 63 of the k-space segment 53, i.e. the temporal series of incomplete sub-data sets 67, are arranged in a four-dimensional array $s(k_y, k_x, n_c, t_n)$. The indices $k_y$, $k_x$ designate the location in k-space; the index $n_c$ designates the coil element ($n_c = 1, \ldots, N_c$); the index $t_n$ designates the nth repetition of the acquisition of the incomplete sub-data set 67 ($t_n = 1, \ldots, N_p$). $N_c$ is the total number of the coil elements employed and is greater than or equal to the spatiotemporal acceleration factor A. Those array elements for which no measurement data exists in the incomplete sub-data sets 67 due to the under-sampling are populated with zero. The array is thereupon Fourier-transformed along the t-axis (fourth dimension) with a discrete Fourier transformation with a transformation length $N_p$, such that the associated temporal frequency spectrum $$s(k_y, k_x, n_c, f_n), -\frac{N_p}{2} \le n < \frac{N_p}{2}$$

is obtained.

Step 2: A low-pass filter with a narrow low-pass band around the zero frequency is applied to this temporal frequency spectrum in order to remove ghost images that are present due to the under-sampling in the frequency spectrum.

Step 3: The static portion that corresponds to the temporally averaged portion of the image series is removed from the temporal frequency spectrum by the values with a frequency of zero in the temporal frequency spectrum being set equal to zero:

$$s(k_y, k_x, n_c, 0) = 0, -\left(\frac{L}{2}\right)_2 \leq k_y < -\left(\frac{L}{2}\right)_2 + L,$$

$$-\frac{M}{2} \leq k_x < \frac{M}{2}, 1 \leq n_c \leq N_c.$$

Step 4: The temporal frequency spectrum modified in this manner is reverse-transformed along the f-axis with an inverse Fourier transformation. A modified temporal series of sub-data sets described by the array $\tilde{s}_{dynamic}(k_y,k_x,n_c,t_n)$ is thereby obtained. This modified series is now complete, meaning that given the associated array $\tilde{s}_{dynamic}(k_y,k_x,n_c,t_n)$ those data values that were equal to zero in the original array due to the under-sampling are also different from zero:

$$\tilde{s}_{dynamic}(k_y, k_x, n_c, t_n) \neq 0, -\left(\frac{L}{2}\right)_2 \leq k_y < -\left(\frac{L}{2}\right)_2 + L,$$

$$-\frac{M}{2} \leq k_x < \frac{M}{2}, 1 \leq n_c \leq N_c, 1 \leq t_n \leq N_p.$$

Step 5: As a series of auxiliary data sets, the modified temporal series of sub-data sets $\tilde{s}_{dynamic}(k_y,k_x,n_c,t_n)$ obtained in this manner serves to calculate the linear weighting factors that are used for a GRAPPA-like reconstruction for every repetition $t_n$. In this manner, $N_p$ sets of linear weighting factors are obtained that are stored for the later reconstruction.

Step 6: The static portion of the original measurement data is again calculated starting from the original temporal series of incomplete sub-data sets 67 (described by the array $s(k_y,k_x,n_c,t_n)$) by an averaging of the temporal series over the time:

$$s_{static}(k_y, k_x, n_c) = \frac{A}{N_p} \sum_{t_p=1}^{N_p} s(k_y, k_x, n_c, t_n).$$

Step 7: The dynamic portion of the original temporal series of the incomplete sub-data sets 67 of the k-space segment 53 is obtained by subtracting the static portion:

$$\tilde{s}_{dynamic}(k_y, k_x, n_c, t_n) =$$

$$\begin{cases} s(k_y, k_x, n_c, t_n) - s_{static}(k_y, k_x, n_c), & \text{if } s(k_y, k_x, n_c, t_n) \neq 0 \\ 0 & \text{otherwise} \end{cases}.$$

Step 8: A GRAPPA-like reconstruction of the data that is applied to the dynamic portion of the sub-data sets ensues using the sets of linear weighting factors calculated in step 5. In this manner a new dynamic, temporal series of sub-data sets is obtained that is described by the array $\hat{s}_{dynamic}(k_y,k_x,n_c,t_n)$. This new dynamic, temporal series is complete, meaning that given the associated array $\hat{s}_{dynamic}(k_y,k_x,n_c,t_n)$ those data values that were equal to zero in the original array $s(k_y,k_x,n_c,t_n)$ due to the under-sampling are also different from zero.

In the following steps of the reconstruction process the static portion that was subtracted in step 7 added-in again and the remaining aliasing artifacts are suppressed.

Step 9: The new dynamic, temporal series of sub-data sets $\hat{s}_{dynamic}(k_y,k_x,n_c,t_n)$ from step 8 is initially Fourier-transformed (discrete Fourier transformation with transformation length $N_p$) along the t-axis in order to obtain the associated temporal frequency spectrum:

$$\hat{s}_{dynamic}(k_y, k_x, n_c, f_n), \frac{N_p}{2} \leq n < \frac{N_p}{2}.$$

Step 10: The values of this associated temporal frequency spectrum with the frequency of zero should (except for small deviations) be equal to zero. These values are now replaced by the static portion $N_p \cdot s_{static}(k_y,k_x,n_c)$, whereby $s_{static}(k_y,k_x,n_c)$ was calculated in step 6.

Step 11: In order to further suppress remaining artifacts in the temporal frequency spectrum so modified, a bandpass filter with a narrow blocking range is applied to the temporal frequency spectrum. The blocking range of the filter is a frequency band that is localized around the frequency $f_m$, for which $$f_m = j \cdot \frac{N_p}{A}, \text{ and } \begin{cases} -\frac{A-1}{2} \leq j \leq \frac{A-1}{2}, j \neq 0, & \text{for } A \text{ odd} \\ -\frac{A}{2} \leq j \leq \frac{A}{2}, j \neq 0, & \text{for } A \text{ even} \end{cases}$$

applies. Remaining artifacts are suppressed in this manner.

Step 12: The temporal series of complete sub-data sets 71 is reconstructed from the filtered frequency spectrum by an inverse Fourier transformation.

These reconstruction steps are now repeated for all $N_B$ partial data sets 63, i.e. for their incomplete sub-data sets 67.

In a further step the complete sub-data sets 71 are used in order to implement a reconstruction of the image series according to the PROPELLER technique. An individual image 69 of the image series is thereby reconstructed in that the complete sub-data sets 71 of the partial data sets 63 that are associated with this individual image 69 are used for reconstruction. The reconstruction method is described in the previously cited work by J. G. Pipe, "Motion Correction with PROPELLER MRI: application to head motion and free-breathing cardiac imaging". Magn. Reson. Med. 42:963-969, 1999. A step decisive for the final image quality is the interpolation of the data points of the sub-data sets 71 on a suitable Cartesian grid. Various known methods can be used for this reconstruction step. Two methods are subsequently described in brief.

The grid method, also known as gridding or the gridding method, represents one possible method used in many cases for interpolation of the data points of the sub-data set 71 on a suitable Cartesian grid. A detailed presentation of this method is found in the document by J. I. Jackson et al., "Selection of a Convolution Function for Fourier Inversion Using Gridding", IEEE Transmission. Med. Imag. 10:473-478, 1991. In one procedure according to the gridding method, each data point of the complete sub-data sets associated with one of the individual images or, respectively, the data point compensated/corrected via weighting is subjected to a convolution (with corresponding convolution seed) and projected onto a suitable Cartesian grid. This raw data set (now existing in a Cartesian form) is then transformed into the image space by means of a fast Fourier transformation (FFT). The individual image to be reconstructed is obtained in that the result of this FFT is divided via the Fourier-transformed convolution kernel (inverse convolution, or deconvolution).

In another preferred method that can be used for reconstruction of an individual image from the associated sub-data sets, the following steps are executed. First, a final Cartesian grid is selected. In a second step, the data of each of the sub-data sets are now transferred onto a respective new grid which exhibits the orientation of the k-space segment belonging to the sub-data set and thereby additionally has a grid constant that corresponds to the grid constant of the final grid. This transfer can ensue, for example, by a sinc-interpolation. For the case that the final grid and the sampling grid of the sub-data set have the same grid constant, no interpolation is required. In a third step, the data of each of the new grids is transferred, interpolated to the final grid and added up in that the data of the new grid are rotated by the angle that corresponds to the rotation angle of the k-space segment, i.e. of the new grid in comparison to the final grid. The data of the final grid so obtained are thereupon Fourier-transformed so that the individual image is obtained.

For example, the third complete sub-data sets 71' of the partial data set 63 are used in order to reconstruct the third individual image 69' of the image series. When present, the third sub-data sets 71' of all partial data sets 63 are thereby preferably used. It may be the case, however, that not all third sub-data sets 71' are used for reconstruction of the third individual image 69', for example when one of the partial data sets 63 cannot be made use of since unacceptably large artifacts have occurred in the acquisition of this partial data set. In this case the reconstruction of the third individual image 69' can also be implemented only with a portion of the third sub-data sets 71'. As described by Arfanakis K. et al. in "k-Space Undersampling in PROPELLER Imaging", Magn. Reson. Med. 53:675-683, 2005, the omission of the data of individual k-space segments in the reconstruction according to the PROPELLER technique negatively affects the image quality to a tolerable extent. Alternatively, in such a case the artifact-plagued third sub-data sets 71' can be replaced by temporally-adjacent sub-data sets (for example, the second or fourth sub-data set in the example) of the same partial data set. The requirement for this alternative is that the temporally-adjacent sub-data sets of the same partial data set are less afflicted with artifacts. If this alternative is used, the data points of the substituted sub-data set 71' that lie in such k-space regions where data points from real third sub-data sets are present are preferably suppressed.

The inventive method exhibits a further advantage is particularly apparent when a method for completion of k-space lines 57 is selected for the incomplete sub-data sets 67 that makes use of additionally-acquired auxiliary data sets are typically used. Such methods are, for example, the methods noted above known as kt-BLAST and kt-SENSE, in which additional low-resolution, complete auxiliary data sets are acquired before acquisition of the actual incomplete measurement data.

With the inventive method it is now possible to omit the acquisition of the low-resolution auxiliary data sets and, instead of these, to use the acquired measurement data that belong to the central region 58 of the k-space matrix 51 and that have been acquired as well in the acquisition of each k-space segment 53.

Despite of the incomplete sampling during the acquisition, the measurement data of the central region 59 are present in a sufficient density since they are acquired in every k-space segment 53, such that from this auxiliary data sets can be generated that exhibit a lower spatial resolution—analogous to typically-acquired auxiliary data sets—but exhibit no aliasing artifacts.

The extraction of the low-resolution auxiliary data sets directly from the incomplete sub-data sets 67 has a number of advantages compared with an additional acquisition of the auxiliary data sets. The total acquisition time can thus be shortened since auxiliary data sets must be acquired separately. Moreover, the time delay between the acquisition of the auxiliary data sets and of the actual image data sets is avoided, which delay, in the case of a movement occurring in-between (for example due to an insufficient breathing stop) would lead to an incorrect reconstruction of complete data sets since auxiliary data sets and the under-sampled measurement data then respectively correspond to a slightly altered subject.

FIG. 5 shows a flow chart of the inventive method in a preferred embodiment.

The acquisition of the measurement data ensues in a first method step 81. The acquisition of the measurement data thereby ensues iteratively, whereby the measurement data of a partial data set 63 are acquired given each iteration step; the measurement data are thus acquired along one of the k-space segments 53 given each iteration step. For this a series of sub-data sets 67 is acquired corresponding to the number of individual images 69 of the series, with each sub-data set 67 being incompletely acquired and the acquisition ensues using the different deviating sampling schemes. The different sampling schemes respectively sample different grid points of the sampling grid associated with the partial data set 63, whereby, however, all grid points of the sampling grid associated with the partial data set 63 are sampled via the acquisition of the entire incomplete sub-data sets 67.

The reconstruction of complete sub-data sets 71 from the incomplete sub-data sets 67 ensues in a second method step 83. This reconstruction thereby ensues iteratively. The corresponding complete sub-data sets 71 are reconstructed from all incomplete sub-data sets 67 of a partial data set 63 in an iteration step.

The iterative reconstruction of the individual image 69 of the image series ensues in a third method step 85. An individual image 69 is thereby reconstructed in an iteration step in that all complete sub-data sets 71 associated with the individual image 69 are used for the reconstruction of the individual image 69.

A comparison of the inventive method according to the above exemplary embodiment with methods in which a purely Cartesian sampling of k-space is affected (in which thus individual k-space segments are not rotated relative to one another) now ensues in the following. In the following it is assumed that the matrix size of quadratic k-space is M=192. Furthermore, it is assumed that respective S=15 k-space lines are sampled in a sub-data set, whereby respectively every third k-space line is sampled. This corresponds to a spatiotemporal acceleration factor of A=3.

Robustness with Regard to Movement:

While (as stated above) approximately six to seven heartbeats are necessary for a complete acquisition of a slice in the exemplary embodiment, four to five heartbeats are sufficient given a purely Cartesian sampling and segmentation. This results from the following formula:

$$HB_{Cartesian} = \frac{M}{S \times A}.$$

Although this is slightly faster, here the problem also occurs in the acquisition that patients typically cannot perfectly hold their breath during the acquisition. This means that movement has occurred between the heartbeats.

In both methods the acquisition of the measurement data in a single k-space segment is comparably quick compared with the typical patient movement.

However, since k-space segments must first be incompletely acquired given a purely Cartesian sampling and segmentation in order to then complete the incompletely-acquired k-space matrix, a patient movement occurring during the acquisition causes comparably severe artifacts in the reconstructed images. Given a purely Cartesian sampling of k-space, the k-space signal acquired in various heartbeats is thus altered by the movement to the effect that ghost images and/or blurrings arise in the phase coding direction upon image reconstruction.

In the inventive method the incomplete sub-data sets 67 of a single k-space segment 53 or of a single partial data set 63 are completed such that the complete sub-data set 71 inherently exhibits slight movement artifacts. An insufficient breath-hold in the acquisition therefore primarily leads to an incorrect alignment of the individual k-space segments 53 or partial data sets 63 relative to one another.

In the inventive method, however, the individual k-space segments 53 overlap in a central circular region 59 of the k-space matrix 51. Since measurement data are repeatedly acquired in this region, these measurement data acquired repeatedly can be used to compensate for rigid body rotations and translations that have occurred, however, the acquisition of the individual k-space segments. Only when a movement of a non-rigid character and/or a movement in the slice direction have occurred, the incorrect alignment of the individual k-space segments 53 relative to one another that arise from this cannot be corrected in the reconstruction of the individual images.

The latter cited incorrect alignments typically occur only in a small number of k-space segments 53 and consequently in the partial data sets 63, typically in the k-space segments 53 or, respectively, partial data sets 63 that are acquired at the end of a breath-hold. In this case the comparison of the central measurement data of the different k-space segments 53 at the least allows the possibility to identify these k-space segments 53. The k-space segments 53 so identified can be excluded in the further processing of the measurement data. The exclusion can be either complete or partial, the latter in that, for example, only the measurement data of the k-space regions that have already been acquired by other k-space segments 53 are discarded.

Given a purely Cartesian segmenting and sampling of a k-space matrix, however, this advantage just described cannot be utilized (for the reasons noted earlier).

Even if no movement correction were applied in the reconstruction of the image data, the inventive method would deliver a better image quality since a radial coverage of the k-space with individual k-space segments 53 and a reconstruction of the image in the PROPELLER technique are less prone to movement artifacts than a purely Cartesian sampling of k-space. Robustness with regard to an azimuthal under-sampling:

Relative to a purely Cartesian method, the inventive method exhibits a further advantage that can be utilized to accelerate the inventive method.

As stated above, four to five heartbeats are sufficient in order to acquire a slice given a purely Cartesian sampling while an overlap of the k-space segments 53 occurs in the inventive method given k-space segments 53 rotated relative to one another, such that six to seven heartbeats are necessary for sampling of the k-space matrix 51. Compared with a purely Cartesian sampling of the k-space matrix 51, the number of the heartbeats necessary for sampling is increased by a factor of $\pi/2$.

Nevertheless, it can be shown (see, for example, the document by Arfanakis K. et al., "k-Space Under-sampling in PROPELLER Imaging", Magn. Reson. Med. 53:675-683, 2005) that an under-sampling of k-space such that whole k-space segments 53 (and therewith whole partial data sets 63) are not sampled as well causes only a slight reduction of the image quality, even when up to 50% of the k-space segments 53 are not sampled. This means that the inventive method can be fashioned such that only four to five heartbeats are likewise required for acquisition of the image data of a slice of the heart if the time duration of the sampling should pose a problem.

Comparison of the Image Reconstruction Times:

A comparison now follows of the image reconstruction times in the inventive method with conventional methods in which a temporal image series is acquired with a purely Cartesian, segmented k-space sampling, for example with the methods UNFOLD, TSENSE, kt-BLAST, kt-SENSE and TGRAPPA described earlier.

Since the matrix size in the production of time-resolved image series is typically relatively small compared with matrix sizes in static MRI, the reconstruction of the individual images in the PROPELLER technique requires comparably little time. The main portion of the reconstruction time is therefore required to reconstruct complete sub-data sets 71 from incomplete sub-data sets 67. Under this assumption, the reconstruction of the dynamic image series takes longer by the factor that specifies the number of the individual k-space segments, thus $N_B$, since the reconstruction of complete sub-data sets 71 is implemented separately for each k-space segment 53.

The inventive method exhibits the advantage that, as illustrated above, an acquisition of low-resolution auxiliary data sets is not necessary for reconstruction, such that the processing of the acquired measurement data can begin immediately after acquisition of the measurement data. Under the assumption that a method for the reconstruction of the complete sub-data sets 71 from the incomplete sub-data sets 67 is selected in which this step ensues separately for each partial data set 63, the processing of the acquired measurement data can begin immediately after acquisition of a partial data set 63.

For example, for the CINE imaging of the heart described in the exemplary embodiment, this means that the data processing and the reconstruction of complete sub-data sets 71 can be begun immediately after the end of the acquisition of a partial data set 63, thus immediately after the end of a heart cycle. When it is additionally possible to process the incomplete sub-data sets 67 of a partial data set 63 at least as quickly as its acquisition, a fast processing of the measurement data is ensured since only the last partial data set 63 with its incomplete sub-data sets 67 must be processed after the end of the measurement data acquisition. In this case, images can be obtained in a time comparable to that of conventional methods. It appears realistic to implement the algorithms necessary for this, such that these reconstruction times can be maintained.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquisition and generation of a time-resolved image series comprised of a plurality of individual magnetic resonance images, said method comprising the steps of:
   acquiring magnetic resonance data from a region of an examination subject containing an anatomical organ exhibiting quasi-periodical movement and entering said data into k-space by sampling k-space in segments with a plurality of partial data sets, with sampling points of each of said partial data sets corresponding to grid points of a Cartesian sampling grid in each k-space segment, and rotating the respective Cartesian sampling grids of the k-space segments relative to each other;
   acquiring said magnetic resonance data by acquiring a plurality of incomplete sub-data sets for each of said partial data sets, with each incomplete sub-data set being respectively associated with one of said individual images, with the acquisition of the incomplete sub-data sets for a respective partial data set ensuing along the sampling grid of that partial data set with different, alternating sampling schemes, and sampling other grid points of the sampling grid of that partial data set with said different sampling schemes;
   from at least some of the partial data sets, reconstructing a plurality of complete sub-data sets from the incomplete sub-data sets; and
   reconstructing said individual images by, for each of said individual images, using at least some of the complete sub-data sets that are associated with that individual image.

2. A method as claimed in claim 1 comprising acquiring the incomplete data sets of a respective partial data set in immediate succession.

3. A method as claimed in claim 1 comprising acquiring the incomplete sub-data sets of a partial data set after a trigger point in time that characterizes the quasi-periodic movement of the anatomical organ.

4. A method as claimed in claim 1 comprising for each partial data set, sampling all grid points of the sampling grid associated with that partial data set for the entirety of all sub-data sets of that partial data set.

5. A method as claimed in claim 1 comprising for each partial data set, sampling all grid points of the sampling grid of that partial data set multiple times for the entirety of all sub-data sets of that partial data set.

6. A method as claimed in claim 1 comprising cyclically alternating said different sampling schemes for acquiring incomplete sub-data sets.

7. A method as claimed in claim 1 wherein each partial data set comprises a plurality of k-space lines, and wherein the step of sampling the grid points of the sampling grid for the respective partial data sets with different sampling schemes comprises employing A different sampling schemes with only every $A^{th}$ k-space line of the sampling grid of the respective partial data set being sampled in each of said A different sampling schemes, and shifting the sampled k-space lines from sampling scheme-to-sampling scheme.

8. A method as claimed in claim 1 comprising acquiring the respective incomplete data sets with a plurality of coil elements each having a different spatial sensitivity, and using information characterizing the respective sensitivities of the individual coils for reconstructing the complete sub-data sets from said incomplete sub-data sets.

9. A method as claimed in claim 1 comprising reconstructing the respective complete sub-data sets from the incomplete sub-data sets using further complete auxiliary data sets associated with a central region of k-space.

10. A method as claimed in claim 1 comprising rotating the individual k-space segments relative to one another around a central point of k-space.

11. A method as claimed in claim 10 comprising automatically computationally determining auxiliary data sets from the respective incomplete sub-data sets, and reconstructing the respective complete sub-data sets from the incomplete sub-data sets using said further auxiliary data sets.

12. A magnetic resonance apparatus for acquisition and generation of a time-resolved image series comprised of a plurality of individual magnetic resonance images, comprising:
   a magnetic resonance scanner operated by a control unit to acquire magnetic resonance data from a region of an examination subject containing an anatomical organ exhibiting quasi-periodical movement, with said control unit entering said data into k-space by sampling k-space in segments with a plurality of partial data sets, with sampling points of each of said partial data sets corresponding to grid points of a Cartesian sampling grid in each k-space segment, and rotating the respective Cartesian sampling grids of the k-space segments relative to each other;
   said control unit being configured to operate said magnetic resonance scanner to acquire said magnetic resonance data by acquiring a plurality of incomplete sub-data sets for each of said partial data sets, with each incomplete sub-data set being respectively associated with one of said individual images, with the acquisition of the incomplete sub-data sets for a respective partial data set ensuing along the sampling grid of that partial data set with different, alternating sampling schemes, and by sampling other grid points of the sampling grid of that partial data set with said different sampling schemes;
   a computer that, for at least some of the partial data sets, is configured to reconstruct a plurality of complete sub-data sets from the incomplete sub-data sets; and
   said computer being configured to reconstruct said individual images by using, for each of said individual images, at least some of the complete sub-data sets that are associated with that individual image.

13. A non-transitory computer-readable storage medium encoded with a data structure loadable into a computer of a magnetic resonance apparatus, said data structure, when said computer-readable medium is loaded into said computer, causing said computer to operate said magnetic resonance apparatus to acquire and generate a time-resolved image series comprised of a plurality of individual magnetic resonance images of an anatomical organ of an examination subject exhibiting a quasi-periodical anatomical organ movement, by causing said computer to:
   acquire magnetic resonance data from a region of an examination subject containing an anatomical organ exhibiting quasi-periodical movement and enter said data into k-space by sampling k-space in segments with a plurality of partial data sets, with sampling points of each of said partial data sets corresponding to grid points of a Cartesian sampling grid in each k-space segment, and rotating the respective Cartesian sampling grids of the k-space segments relative to each other;

acquire said magnetic resonance data by acquiring a plurality of incomplete sub-data sets for each of said partial data sets, with each incomplete sub-data set being respectively associated with one of said individual images, with the acquisition of the incomplete sub-data sets for a respective partial data set ensuing along the sampling grid of that partial data set with different, alternating sampling schemes, and sampling other grid points of the sampling grid of that partial data set with said different sampling schemes;

for at least some of the partial data sets, reconstruct a plurality of complete sub-data sets from the incomplete sub-data sets; and reconstruct said individual images by, for each of said individual images, using at least some of the complete sub-data sets that are associated with that individual image.

* * * * *